(12) United States Patent
Ling

(10) Patent No.: US 9,462,677 B2
(45) Date of Patent: Oct. 4, 2016

(54) MINIMIZING CROSSTALK IN A DATA TRANSFER DEVICE

(75) Inventor: Yun Ling, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 13/977,057

(22) PCT Filed: Dec. 21, 2011

(86) PCT No.: PCT/US2011/066558
§ 371 (c)(1),
(2), (4) Date: Jul. 16, 2014

(87) PCT Pub. No.: WO2013/095449
PCT Pub. Date: Jun. 27, 2013

(65) Prior Publication Data
US 2015/0223321 A1    Aug. 6, 2015

(51) Int. Cl.
| | | |
|---|---|---|
| H01R 13/00 | (2006.01) |
| H05K 1/02 | (2006.01) |
| H01R 13/6471 | (2011.01) |
| H04L 25/02 | (2006.01) |
| H05K 3/30 | (2006.01) |
| H01R 13/6461 | (2011.01) |

(52) U.S. Cl.
CPC ........ *H05K 1/0228* (2013.01); *H01R 13/6471* (2013.01); *H04L 25/0274* (2013.01); *H05K 3/30* (2013.01); *H01R 13/6461* (2013.01); *Y10T 29/49133* (2015.01)

(58) Field of Classification Search
CPC ............. H05K 1/0213; H05K 1/0228; H05K 1/0245; H05K 1/0246
USPC ......... 174/250–255, 261; 361/117, 118, 119, 361/761, 728, 748, 777, 780, 803; 333/4, 5, 333/33; 439/540.1, 101, 941, 76.1; 257/786, 206
See application file for complete search history.

(56) References Cited

U.S. PATENT DOCUMENTS

| | | | | |
|---|---|---|---|---|
| 2,667,543 A * | 1/1954 | Smith | ................... | H01H 63/02 174/33 |
| 5,357,050 A * | 10/1994 | Baran | ................... | H05K 1/0228 174/261 |
| 5,966,056 A * | 10/1999 | Thornton | .................. | H04L 5/20 174/32 |
| 6,290,532 B1 * | 9/2001 | Vermeersch | ........... | H05K 3/301 439/460 |
| 6,946,926 B2 * | 9/2005 | Shimada | ................. | H01P 3/023 333/238 |

(Continued)

FOREIGN PATENT DOCUMENTS

| | | | | |
|---|---|---|---|---|
| JP | 2001-015925 A * | 1/2001 | ............... | H05K 3/46 |
| JP | 2010-027437 A | 2/2010 | | |

(Continued)

OTHER PUBLICATIONS

International Search Report and Written Opinion received for PCT application No. PCT/US2011/066558, mailed on Sep. 25, 2012, 10 pages.

(Continued)

*Primary Examiner* — William H Mayo, III
(74) *Attorney, Agent, or Firm* — Jordan IP Law, LLC

(57) ABSTRACT

Systems and methods provided may involve arranging a first differential pair and a second differential pair and adjusting spacing arrangements between the first differential pair and the second differential pair to minimize crosstalk.

30 Claims, 4 Drawing Sheets

(56) References Cited

U.S. PATENT DOCUMENTS

| | | | |
|---|---|---|---|
| 7,271,985 B1* | 9/2007 | Buhler | G11B 5/48 360/245.9 |
| 7,446,258 B1* | 11/2008 | Sosna | H01B 11/125 174/33 |
| 7,609,125 B2* | 10/2009 | van Quach | H01L 23/66 333/238 |
| 8,119,919 B2* | 2/2012 | Tagi | H05K 1/0228 174/254 |
| 2002/0066589 A1* | 6/2002 | Lin | H01B 11/005 174/113 R |
| 2005/0077977 A1* | 4/2005 | Beale | H01P 3/02 333/5 |
| 2005/0099240 A1* | 5/2005 | Lin | H01P 3/02 333/5 |
| 2010/0093227 A1 | 4/2010 | Kirk | |
| 2012/0161893 A1* | 6/2012 | Ye | H01P 3/026 333/5 |

FOREIGN PATENT DOCUMENTS

| | | |
|---|---|---|
| TW | I306009 B | 2/2009 |
| WO | 2013/095449 A1 | 6/2013 |

OTHER PUBLICATIONS

International Preliminary Report on Patentability and Written Opinion received for PCT Patent Application No. PCT/US2011/066558, mailed on Jul. 3, 2014, 7 pages.

Office Action and Search Report for Taiwanese Patent Application No. 101148343, dated May 26, 2015, 8 pages. Includes 5 pages of English translation.

* cited by examiner

MINIMIZING CROSSTALK IN A DATA TRANSFER DEVICE

BACKGROUND

1. Technical Field

Embodiments generally relate to signal integrity. More particularly, embodiments relate to minimizing crosstalk interference in a data transfer device.

2. Discussion

Crosstalk management may be a significant design consideration in electronic devices. A source of crosstalk may be connector components or printed circuit board (PCB) traces that carry data. Balancing form factor requirements while minimizing crosstalk in these devices may be a high priority.

BRIEF DESCRIPTION OF THE DRAWINGS

The various advantages of the embodiments of the present invention will become apparent to one skilled in the art by reading the following specification and appended claims, and by referencing the following drawings, in which:

DETAILED DESCRIPTION

Figure 1:
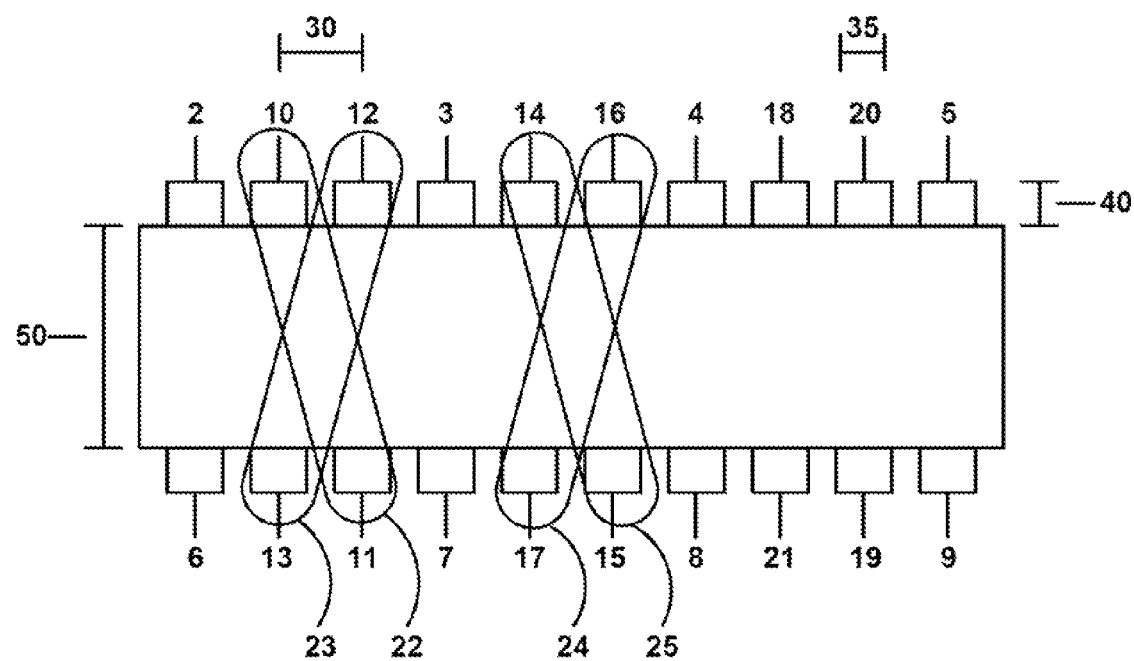
FIG. 1 is a block diagram of an example of an apparatus that implements crosstalk minimization in a multi-row data transfer device in accordance with an embodiment of the invention.

Embodiments may include an apparatus including a substrate, a first ground pin coupled to the substrate, and a second ground pin coupled to the substrate. The apparatus may also include a first differential pair coupled to the substrate, wherein the first differential pair may include a first connector pin of the first differential pair located on a first row of the substrate, and a second connector pin of the first differential pair located on a second row of the substrate. The first connector pin of the first differential pair and the second connector pin of the first differential pair may have opposing polarities and may be arranged to be substantially diagonally opposed to one another. The apparatus may also include second differential pair coupled to the substrate, wherein the second differential pair may include a first connector pin of the second differential pair located on the first row of the substrate and a second connector pin of the second differential pair located on the second row of the substrate. The first connector pin of the second differential pair and the second connector pin of the second differential pair may have opposing polarities and may be arranged to be diagonally opposed to one another.

Embodiments may also include a substrate, a first ground pin embedded in the substrate, and a second ground pin embedded in the substrate. The apparatus may also include a first differential pair embedded in the substrate, wherein the first differential may include a first connector pin of the first differential pair located on a first row and a second connector pin of the first differential pair located on a second row. The first connector pin of the first differential pair and the second connector pin of the first differential pair may be arranged to be substantially diagonally opposed to one another and can have opposing polarities. The apparatus may also include a second differential pair embedded in a substrate, wherein the second differential pair may include a first connector pin of the second differential pair located on the first row and a second connector pin of the second differential pair located on the second row. The first connector pin of the first differential pair and the second connector pin of the second differential pair may be arranged to be diagonally opposed to one another and can have opposing polarities.

Embodiments may also include a substrate, a first ground pin embedded in the substrate, and a second ground pin embedded in the substrate. The apparatus may also include a first differential pair embedded in the substrate on a first row, wherein the first differential may include a first connector pin of the first differential pair and a second connector pin of the first differential pair having opposing polarities. The apparatus may also include a second differential pair embedded in a substrate on a second row, wherein the second differential pair may include a first connector pin of the second differential pair and a second connector pin of the second differential pair having opposing polarities. The first differential pair may be offset by an offset spacing length from the second differential pair to minimize crosstalk.

Embodiments may involve a computer implemented method including arranging a first connector pin of a first differential pair and a second connector pin of the first differential pair to minimize crosstalk. The first connector pin of the first differential pair and the second connector pin of the first differential pair may have opposing polarities. The method may also provide for arranging a first connector pin of a second differential pair and a second connector pin of the second differential pair to minimize crosstalk. The first connector pin of the second differential pair and the second connector pin of the second differential pair may have opposing polarities. The method may also provide for adjusting a first spacing arrangement between the first connector pin of the first differential pair and the second connector pin of the first differential pair to minimize crosstalk. The method may also provide for adjusting a second spacing arrangement between the first connector pin of the second differential pair and the second connector pin of the second differential pair to minimize crosstalk.

Turning now to FIG. 1, a block diagram of a substrate 60 is shown. The substrate 60 may be, for example, a printed circuit board (PCB) or a connecting device such as a connector housing. In this embodiment, the substrate 60 may be a multi-row connecting device, wherein a first row of ground pins and connecting or connector pins may be located on a top surface of the substrate 60, and a second row of ground pins and connecting pins may be located on a bottom surface of the substrate 60.

The substrate 60 may include ground pins 2-9 and connector pins 10-21. As shown, a ground pin may be located at intervals preceding and/or following at least one connector pin. For example, the connector pins 10, 12 may be located in between the ground pins 2, 3, and the connector pins 11, 13 may be located in between the ground pins 6 and 7.

The connector pins 10, 11 may form a first differential pair 22. The first connector pin 10 and the second connector pin 11 of the first differential pair 22 may have opposing polarities, and may be arranged to be substantially diagonally opposed to one another. That is, the first connector pin 10 may be located on the top row of the substrate 60, and the second connector pin 11 may be located to form a substantially opposing diagonal on the bottom row of the substrate 60. Similarly, the connector pins 12, 13 may form a second differential pair 23, wherein the first connector pin 12 and the second connector pin 13 of the second differential pair 23 may have opposing polarities, and may arranged to be substantially diagonally opposed to one another. This arrangement may minimize crosstalk between the first differential pair 22 and the second differential pair 23.

A first differential cancellation property may be taken advantage of with respect to the arrangement of the differential pairs. Specifically, if the first connector pin 10 of the first differential pair 22 (i.e., a first crosstalk "aggressor") may be configured to create an equal or approximately equal amount of crosstalk as the second connector pin 11 (i.e., a second crosstalk "aggressor") of the first differential pair 22 in opposing polarities, then the net crosstalk effect of the first differential pair 22 on the second differential pair 23 (i.e., the crosstalk "victim") may be minimized. The net crosstalk effect of the second differential pair 23 on the first differential pair 22 may be minimized in a similar manner as well.

A second differential cancellation property may be taken advantage of with respect to the arrangement of the individual pins of the differential pairs as well. Specifically, the first connector pin 10 of the first differential pair 22 (i.e., the "aggressor") may be configured to generate an amount of crosstalk in a first polarity in the first connector pin 12 (i.e., the first "victim") of the second differential pair 23 that may be approximately equal or equal to the amount of crosstalk generated in the same polarity in the second connector pin 13 (i.e., the second "victim") of the second differential pair 23. That is, the crosstalk generated by the aggressor first connector pin 10 on the victim first connector pin 12 and the victim second connector pin 13 may be configured to neutralize each other, thereby leaving the second differential pair 23 with minimal differential crosstalk effect from the aggressor first connector pin 10.

Similarly, in the case of the second connector pin 11 (i.e., another "aggressor") of the first differential pair 22, the second connector pin 11 may be configured to generate an amount of crosstalk in a first polarity in the first connector pin 12 (i.e., the first "victim") of the second differential pair 23 that may be approximately equal or equal to the amount of crosstalk generated in the same polarity in the second connector pin 13 (i.e., the second "victim") of the second differential pair 23. That is, the crosstalk generated by the aggressor second connector pin 11 on the victim first connector pin 12 and the victim second connector pin 13 may be configured to neutralize each other, thereby leaving the second differential pair 23 with minimal differential crosstalk effect from the aggressor first connector pin 11. Similar principles may be utilized to minimize the crosstalk effect from the differential pair 23 on the differential pair 22.

Other design aspects of the substrate 60 may be configured to achieve crosstalk cancellation. For example, a connector pin distance 30 between first connector pin 10 of the first differential pair 22 and the first connector pin 12 of the second differential pair 23, measured here by the midpoint of the connector pins, may be chosen to minimize crosstalk. In addition, a pin width 35 and a pin height 40 of a connector pin may be chosen to minimize crosstalk as well. In certain embodiments, the pin width 35 or the height 40 of connector pins on the substrate 60 may be uniform. In other embodiments, this may not be so. A substrate thickness 50 may be designed to minimize differential crosstalk as well.

The arrangement and numbering of blocks depicted in FIG. 1 is not intended to imply an order of operations to the exclusion of other possibilities. Those of skill in the art will appreciate that the foregoing systems and methods are susceptible of various modifications and alterations. In this embodiment, the ground pins may be located before and after a uniform number of connector pins (e.g., two connector pins). For example, the ground pins 2, 3 surround the two connector pins 10, 12, and the ground pins 3, 4 surround the two connector pins 14, 16. However, in other embodiments, the ground pins may be located randomly between the connector pins.

Figure 2:
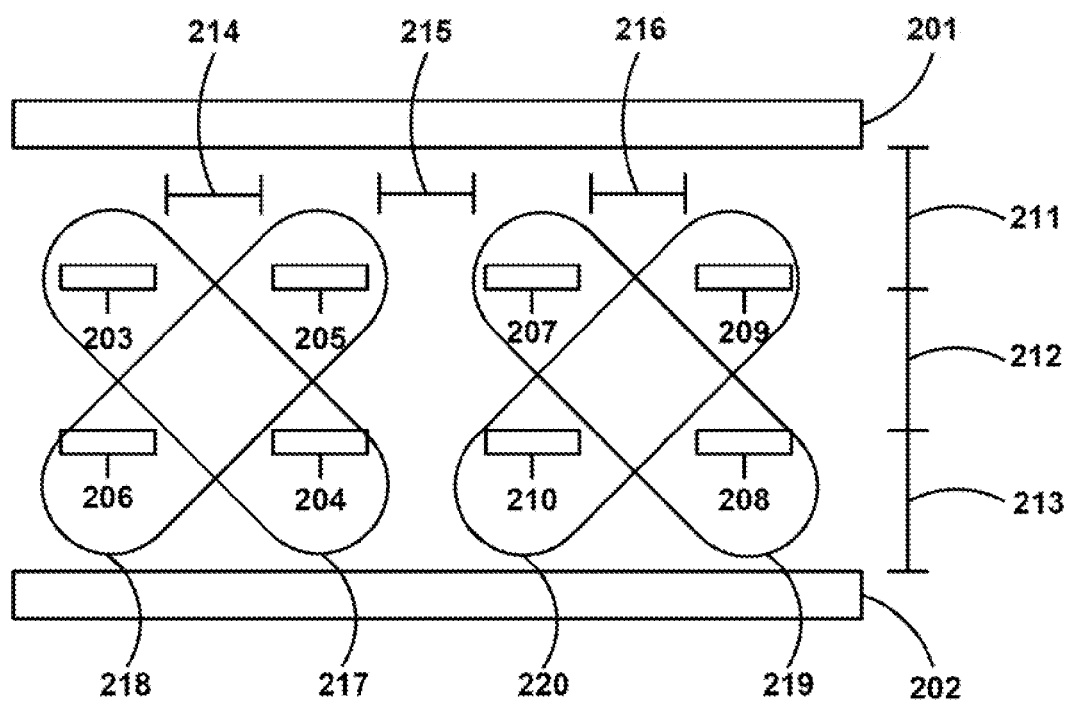
FIG. 2 is a block diagram of an example of an apparatus that implements crosstalk minimization in a stripline routing data transfer device in accordance with an embodiment of the invention.

Turning now to FIG. 2, a block diagram of a substrate 200 is shown. In this exemplary embodiment, the substrate 200 may be a printed circuit board (PCB) utilizing dual stripline routing to route signals. The PCB substrate 200 may include an embedded top ground plane 201 and an embedded bottom ground plane 202.

In addition, the PCB substrate 200 may include a first differential pair 217 embedded in the PCB substrate 200, wherein the first differential pair 217 may include a first connector pin 203 located on a first row of connector pins and a second connector pin 204 located on a second row of connector pins. The first connector pin 203 of the first differential pair 217 and the second connector pin 204 of the first differential pair 217 may have opposing polarities. The PCB substrate 200 may also include a second differential pair 218 embedded in the PCB substrate 200, wherein the second differential pair 218 may include a first connector pin 205 located on the first row of connector pins and a second connector pin 206 located on the second row of connector pins. The first connector pin 205 of the second differential pair 218 and the second connector pin 206 of the second differential pair 218 may have opposing polarities. The PCB substrate may also include a third differential pair 219 including a first connector pin 207 and a second connector pin 208 and a fourth differential pair 220 including a first connector pin 209 and a second connector pin 210.

Similar to the embodiment described in FIG. 1, the first connector pin 203 of the first differential pair 217 and the second connector pin 204 of the first differential pair 217 may be arranged to be substantially diagonally opposed to one another. Also, the first connector pin 205 of the second differential pair 218 and the second connector pin 206 of the second differential pair 218 may be arranged to be substantially diagonally opposed to one another as well. As will be discussed in greater detail, the embodiment may utilize differential cancellation properties to minimize crosstalk.

For example, with regard to the first differential cancellation property, the first connector pin 203 of the first differential pair 217 (i.e., a first crosstalk "aggressor") may be configured to create an equal or approximately equal amount of crosstalk on the second differential pair 218 as the second connector pin 204 of the second differential pair 218 (i.e., a second crosstalk "aggressor") in an opposing polarity. Thus, the net crosstalk effect of the first differential pair 217 on the second differential pair 218 may be minimized, and the net crosstalk effect of the second differential pair 218 on the first differential pair 217 may be minimized in a similar manner as well.

The arrangement of the individual connector pins of the differential pairs may be configured to minimize crosstalk as well. Specifically, the first connector pin 203 of the first differential pair 217 (i.e., the "aggressor") may be configured to generate an amount of crosstalk in a first polarity in the first connector pin 205 (i.e., the first "victim") of the second differential pair 218 that may be approximately equal or equal to the amount of crosstalk generated in the same polarity in the second connector pin 206 (i.e., the second "victim") of the second differential pair 218. That is, the crosstalk generated by the aggressor first connector pin 203 on the victim first connector pin 205 and the victim second connector pin 206 may generally neutralize each other, thereby leaving the second differential pair 218 with a minimal differential crosstalk effect from the aggressor first connector pin 203. The differential crosstalk effect of the second connector pin 204 of the first differential pair 217 on the second differential pair 218 may be minimized in a similar manner as well.

Other design aspects may be implemented to obtain the condition for crosstalk cancellation. For example, a connector pin distance 214 (e.g., a distance between the first connector pin 203 of the first differential pair 217 and the first connector pin 205 of the second differential pair 218) may be chosen to minimize crosstalk. In addition, an in-row separation 215 (e.g., a distance between first connector pin 205 of the second differential pair 218 and a first connector pin 207 of a third differential pair 219) may be chosen to minimize differential crosstalk. Also, a first ground separation 211 (e.g., the distance from the first ground 201 to the first connector pin 203 of the first differential pair 217) and a second ground separation 213 (e.g., the distance from the second ground 202 to the second connector pin 206 of the second differential pair 218), along with the selection of a differential pair separation 212 (e.g., the distance from the first connector pin 203 of the first differential pair 217 to the second connector pin 204 of the first differential pair 217), may all be selected to minimize differential crosstalk as well.

The arrangement and numbering of blocks depicted in FIG. 2 is not intended to imply an order of operations to the exclusion of other possibilities. Those of skill in the art will appreciate that the foregoing systems and methods are susceptible of various modifications and alterations. For example, in the embodiment described in FIG. 2, the distances of the first ground separation 211 and the second ground separation 213 may be equal. However, in other embodiments, this may not be so.

Figure 3:
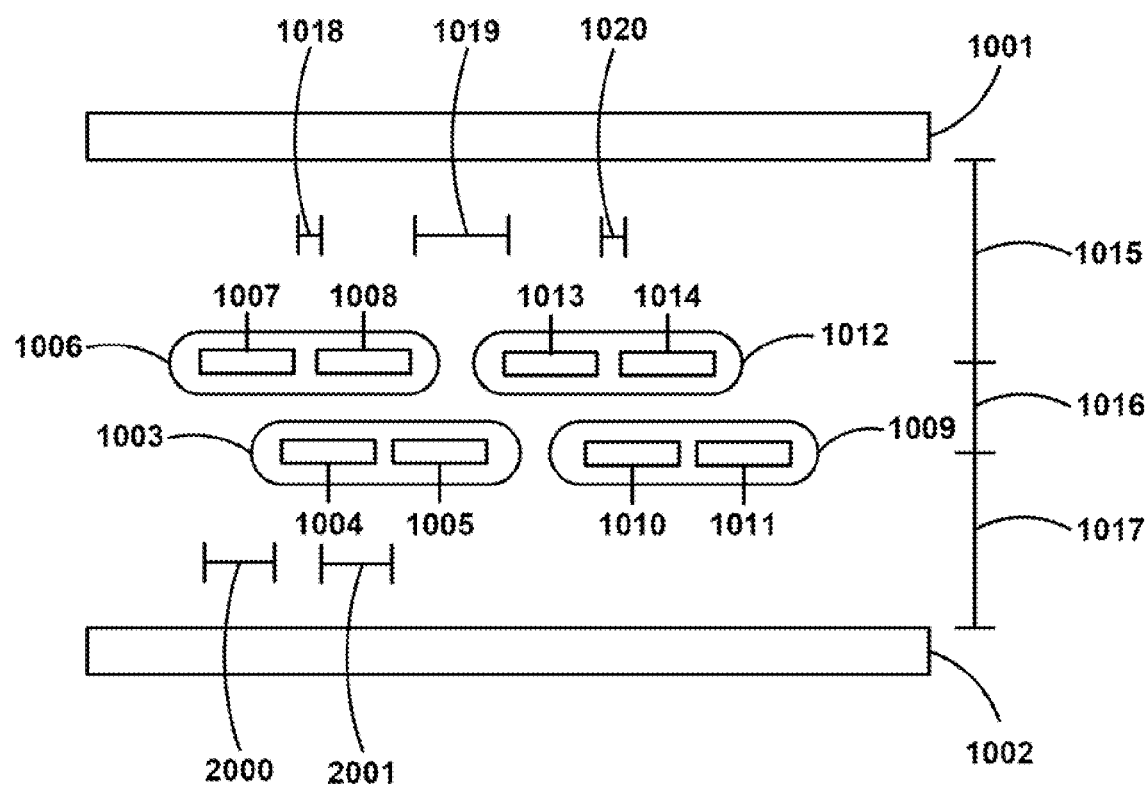
FIG. 3 is a block diagram of an example of an apparatus that implements crosstalk minimization in a stripline routing data transfer device in accordance with another embodiment of the invention.

Turning now to FIG. 3, a block diagram of a substrate 1000 is shown. In this exemplary embodiment, the substrate 1000 may be a printed circuit board (PCB) utilizing dual stripline routing to route signals. The PCB substrate 1000 may include an embedded top ground plane 1001 and an embedded bottom ground plane 1002.

The PCB substrate 1000 may also include a first differential pair 1003 embedded in the PCB substrate 1000, wherein the first differential pair 1003 may be located on a first row of connector pins, and may include a first connector pin 1004 and a second connector pin 1005. The first connector pin 1004 of the first differential pair 1003 and the second connector pin 1005 of the first differential pair 1003 may have opposing polarities.

In addition, the PCB substrate 1000 may include a second differential pair 1006 embedded in the PCB substrate 1000. The second differential pair 1006 may be located on a second row of connector pins, and may include a first connector pin 1007 and a second connector pin 1008. The first connector pin 1007 and the second connector pin 1008 of the second differential pair 1006 may have opposing polarities. The PCB substrate 1000 may also include a third differential pair 1009 including a first connector pin 1010 and a second connector pin 1011 and a fourth differential pair 1012 including a first connector pin 1013 and a second connector pin 1014.

As shown, the first differential pair 1003 may be offset by using an offset spacing length 2000 from the second differential pair 1006. More particularly, the first connector pin 1004 of the first differential pair 1003 may be offset from the first connector pin 1007 of the second differential pair 1006 in an amount that is approximately equal or equal to an amount that the second connector pin 1005 of the first differential pair 1003 is offset from the second pin 1008 of the second differential pair 1006. Similar to the embodiments described above, the embodiments described in FIG. 3 may be configured to utilize multiple differential cancellation properties to minimize crosstalk.

First, as discussed above, the arrangement of the individual connector pins of the differential pairs may be configured to minimize crosstalk. For example, in the case of the first connector pin 1004 of the first differential pair 1003 (i.e., a first "aggressor"), the aggressor first connector pin 1004 may generate an amount of crosstalk in a first polarity in the second connector pin 1008 (i.e., the first "victim") of the second differential pair 1006 that is approximately equal or equal to the amount of crosstalk in an same polarity that is generated by the second connector pin 1005 (i.e., a second "aggressor") of the first differential pair 1003 on the victim second connector pin 1008 of the second differential pair 1006. That is, the crosstalk generated by the aggressor first connector pin 1004 and the crosstalk generated by the aggressor second connector pin 1005 on the victim first connector pin 1008 may generally neutralize each other, thereby leaving the victim first connector pin 1008 with a minimal differential crosstalk effect from the first differential pair 1003. This differential cancellation property may be utilized to minimize crosstalk in other connector pins in the embodiment as well.

A second differential cancellation property may be taken advantage of by the arrangement of the differential pairs themselves. The crosstalk effect on the first connector pin 1007 and the second connector pin 1008 of the second differential pair 1006 may be affected by, among other things, the crosstalk effect from first connector pin 1004 and the second connector pin 1005 of the first differential pair 1003. However, the embodiment may be configured such that the net effect of the first differential pair 1003 on both the first connector pin 1007 and the second connector pin 1008 of the second differential pair 1005 is approximately equal or equal to zero. The total crosstalk effect of the second differential pair 1006 on the first differential pair 1003 may be minimized in a similar manner as well.

Other design aspects may be implemented to minimize crosstalk in the PCB substrate 1000 between the differential pairs. For example, a connector pin distance 1018 (e.g., a distance between the first connector pin 1007 and the second connector pin 1008 of the second differential pair 1006) may be chosen to minimize crosstalk. In addition, an in-row separation 1019 (e.g., a distance between the second connector pin 1008 of the second differential pair 1006 and a first connector pin 1013 of a third differential pair 1012) may be chosen to minimize differential crosstalk. Also, a first ground separation 1015 (e.g., the distance from the first ground 1001 to the first connector pin 1007 of the second differential pair 1006) and a second ground separation 1017 (e.g., the distance from the second ground 1002 to the first connector pin 1004 of the first differential pair 1003), along with the selection of a differential pair separation 1016 (e.g., the distance from the first connector pin 1004 of the first differential pair 1003 to the first connector pin 1007 of the second differential pair 1006), may be selected to minimize differential crosstalk as well.

The arrangement and numbering of blocks depicted in FIG. 3 is not intended to imply an order of operations to the exclusion of other possibilities. Those of skill in the art will appreciate that the foregoing systems and methods are susceptible of various modifications and alterations. Other embodiment may provide for different or modified configurations for crosstalk cancellation. For example, in other embodiments, the crosstalk cancellation between rows may be designed so that the sum of the crosstalk effect of a first connector pin of a first differential pair on a first connector pin of a second differential pair and the crosstalk effect of a second connector pin of a first differential pair on a second connector pin of a second differential pair is approximately equal or equal to the sum of the crosstalk effect of a first connector pin of a first differential pair on a second connector pin of a second differential pair and the crosstalk effect of a second connector pin of a first differential pair on a first connector pin of a second differential pair.

Figure 4:
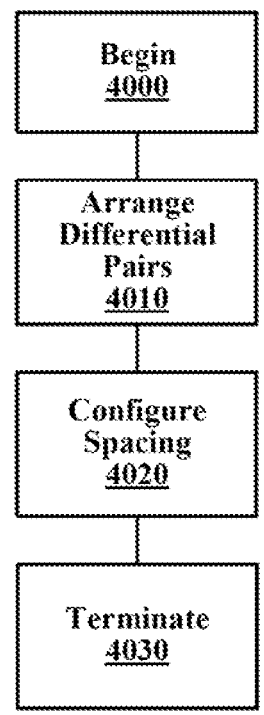
FIG. 4 is a flowchart of an example of a method of arranging components of a data transfer device to minimize crosstalk in accordance with an embodiment of the invention.

Turning now to FIG. 4, flowchart of an example of a method of arranging components of a data transfer device to minimize crosstalk in accordance with an embodiment of the invention is shown. The process may begin at processing block 4000. At block 4010, a first differential pair, such as differential pair 21 (FIG. 1) and a second differential pair, such as differential pair 22 (FIG. 1), on a substrate, such as substrate 1 (FIG. 1), may be configured to implement a differential crosstalk cancellation property. For example, the first connector pin of the first differential pair, such as the first connector pin 10 (FIG. 1), and the second connector pin of the first differential pair, such as the second connector pin 11 (FIG. 1), may be arranged to be substantially diagonally opposed to one another. Also, the first connector pin of the second differential pair, such as the first connector pin 12 (FIG. 1), and the second connector pin of the second differential pair, such as the second connector pin 13 (FIG. 1), may be arranged to be diagonally opposed to one another as well. At block 4020, the spacing arrangements, such as the spacing between the first differential pair and the second differential pair, and the spacing between the first connector pin of the first differential pair and the second connector pin of the first differential pair, may be configured to minimize crosstalk as well. At block 4030, the process may terminate.

The sequence and numbering of blocks depicted in FIG. 4 is not intended to imply an order of operations to the exclusion of other possibilities. Those of skill in the art will appreciate that the foregoing systems and methods are susceptible of various modifications, variations, and alterations. For example, in the embodiment described above, the first and the second connector pin of the first differential pair and the first and the second connector pin of the second differential pair may be arranged to be substantially diagonally opposed to one another. However, in other embodiments, crosstalk in the first and the second differential pair may be minimized by, among other things, utilizing an offset spacing length between the first differential pair from the second differential pair.

It will be evident to persons having the benefit of this disclosure that various modifications and changes may be made to these embodiments without departing from the broader spirit and scope of the embodiments described herein. The specification and drawings are, accordingly, to be regarded in an illustrative rather than a restrictive sense.

Those skilled in the art will appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

In addition, in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding. Any represented signal lines, whether or not having additional information, may actually include one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments of the present invention are not limited to the same. As manufacturing techniques (e.g., photolithography) mature over time, it is expected that devices of smaller size could be manufactured. In addition, well known power/ground connections and other components may or may not be shown within the figures, for simplicity of illustration and discussion, and so as not to obscure certain aspects of the embodiments of the invention. Further, arrangements may be shown in block diagram form in order to avoid obscuring embodiments of the invention, and also in view of the fact that specifics with respect to implementation of such block diagram arrangements are highly dependent upon the platform within which the embodiment is to be implemented, i.e., such specifics should be well within purview of one skilled in the art. Where specific details are set forth in order to describe example embodiments of the invention, it should be apparent to one skilled in the art that embodiments of the invention can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. are used herein only to facilitate discussion, and carry no particular temporal or chronological significance unless otherwise indicated.

I claim:

1. An apparatus comprising:
   a substrate having a top surface and a bottom surface;
   a first ground pin coupled to the substrate;
   a second ground pin coupled to the substrate;
   a first differential pair coupled to the substrate, wherein the first differential pair includes a first connector pin of the first differential pair located on a first row on the top surface of the substrate, and a second connector pin of the first differential pair located on a second row on the bottom surface of the substrate, wherein the first connector pin of the first differential pair and the second connector pin of the first differential pair have opposing polarities and are arranged to be substantially diagonally opposed to one another; and a second differential pair coupled to the substrate, wherein the second differential pair includes a first connector pin of the second differential pair located on the first row on the top surface of the substrate and a second connector pin of the second differential pair located on the second row on the bottom surface of the substrate, and wherein the first connector pin of the second differential pair and the second connector pin of the second differential pair have opposing polarities and are arranged to be diagonally opposed to one another.

2. The apparatus of claim 1, wherein the substrate is one of a printed circuit board (PCB) and a connecting device.

3. The apparatus of claim 1, wherein at least one of the first connector pin of the first differential pair, the second connector pin of the first differential pair, the first connector pin of the second differential pair, and the second connector pin of the second differential pair are located in between the first ground pin and the second ground pin.

4. The apparatus of claim 1, wherein the first connector pin of the first differential pair is configured to create approximately a same amount of crosstalk as the second connector pin of the first differential pair in opposing polarities.

5. The apparatus of claim 1, wherein the first connector pin of the first differential pair is to generate an amount of crosstalk in a first polarity in the first connector pin of the second differential pair that is approximately equal to an amount of crosstalk to be generated in a same polarity in the second connector pin of the second differential pair.

6. The apparatus of claim 1, wherein a connector pin distance of the apparatus is configured to minimize crosstalk.

7. The apparatus of claim 1, wherein at least one of a pin width and a pin height of the first connector pin of the first differential pair is configured to minimize crosstalk.

8. The apparatus of claim 1, wherein a thickness of the substrate is configured to minimize differential crosstalk.

9. An apparatus comprising:
a substrate having a top surface and a bottom surface;
a first ground plane embedded in the top surface of the substrate;
a second ground plane embedded in the bottom surface of the substrate;
a first differential pair embedded in the substrate, wherein the first differential includes a first connector pin of the first differential pair located on a first row and a second connector pin of the first differential pair located on a second row, and wherein the first connector pin of the first differential pair and the second connector pin of the first differential pair are arranged to be substantially diagonally opposed to one another and have opposing polarities; and
a second differential pair embedded in a substrate, wherein the second differential pair includes a first connector pin of the second differential pair located on the first row and a second connector pin of the second differential pair located on the second row, and wherein the first connector pin of the first differential pair and the second connector pin of the second differential pair are arranged to be diagonally opposed to one another and have opposing polarities.

10. The apparatus of claim 9, wherein the substrate is a printed circuit board (PCB).

11. The apparatus of claim 9, wherein the first differential pair and the second differential pair are embedded in between the first ground plane and the second ground plane.

12. The apparatus of claim 9, wherein the first connector pin of the first differential pair is to generate an amount of crosstalk in a first polarity on the second differential pair that is approximately equal to an amount of crosstalk in an opposing polarity that the second connector pin of the first differential pair is to generate on the second differential pair.

13. The apparatus of claim 9, wherein the first connector pin of the first differential pair is to generate an amount of crosstalk in a first polarity in the first connector pin of the second differential pair that is approximately equal to an amount of crosstalk to be generated in a same polarity in the second connector pin of the second differential pair.

14. The apparatus of claim 9, wherein a connector pin distance of the apparatus is configured to minimize crosstalk.

15. The apparatus of claim 9, wherein an in-row separation of the apparatus is configured to minimize crosstalk.

16. The apparatus of claim 9, wherein a differential pair separation of the apparatus is configured to minimize differential crosstalk.

17. An apparatus comprising:
a substrate;
a first ground pin embedded in the substrate;
a second ground pin embedded in the substrate;
a first differential pair embedded in the substrate on a first row, wherein the first differential includes a first connector pin of the first differential pair and a second connector pin of the first differential pair have opposing polarities; and
a second differential pair embedded in a substrate on a second row, wherein the second differential pair includes a first connector pin of the second differential pair and a second connector pin of the second differential pair have opposing polarities, and wherein the first differential pair is offset by an offset spacing length from the second differential pair to minimize crosstalk.

18. The apparatus of claim 17, wherein the substrate is a printed circuit board (PCB).

19. The apparatus of claim 17, wherein the first differential pair and the second differential pair are embedded in between the first ground plane and the second ground plane.

20. The apparatus of claim 17, wherein the first connector pin of the first differential pair is to generate an amount of crosstalk in a first polarity in the second connector pin of the second differential pair that is approximately equal to the amount of crosstalk to be generated in a same polarity between the second connector pin of the first differential pair and the second connector pin of the second differential pair.

21. The apparatus of claim 17, wherein the crosstalk generated from the first differential pair on the first connector pin of the second differential pair is approximately equal to the crosstalk generated from the first differential pair on the second connector pin of the second differential pair.

22. The apparatus of claim 17, wherein a sum of a crosstalk to be generated from the first connector pin of the first differential pair on the first connector pin of the second differential pair and a crosstalk to be generated from the second connector pin of the first differential pair on the second connector pin of the second differential pair is approximately equal to a sum of a crosstalk to be generated from the first connector pin of the first differential pair on the second connector pin of the second differential pair and a crosstalk to be generated from the second connector pin of the first differential pair on the first connector pin of the second differential pair.

23. The apparatus of claim 17, wherein a connector pin distance of the apparatus is configured to minimize crosstalk.

24. The apparatus of claim 17, wherein an in-row separation of the apparatus is configured to minimize crosstalk.

25. The apparatus of claim 17, wherein a differential pair separation of the apparatus is configured to minimize differential crosstalk.

26. A method comprising:
    arranging a first connector pin of a first differential pair and a second connector pin of the first differential pair to minimize crosstalk, wherein the first connector pin of the first differential pair and the second connector pin of the first differential pair have opposing polarities;
    arranging a first connector pin of a second differential pair and a second connector pin of the second differential pair to minimize crosstalk, wherein the first connector pin of the second differential pair and the second connector pin of the second differential pair have opposing polarities;
    adjusting a first spacing arrangement between the first connector pin of the first differential pair and the second connector pin of the first differential pair to minimize crosstalk; and
    adjusting a second spacing arrangement between the first connector pin of the second differential pair and the second connector pin of the second differential pair to minimize crosstalk,
    wherein the adjusting of the first spacing arrangement and the adjusting of the second spacing arrangement generate an amount of crosstalk in a first polarity in the first connector pin of the second differential pair that is approximately equal to an amount of crosstalk generated in a same polarity in the second connector pin of the second differential pair.

27. The method of claim 26, wherein the first connector pin of the first differential pair is arranged to be substantially diagonally opposed to the second connector pin of the first differential pair.

28. The method of claim 26, wherein the first differential pair is offset a spacing length from the second differential pair.

29. The method of claim 26, wherein adjusting a first spacing arrangement includes configuring a connector pin distance to minimize crosstalk.

30. The method of claim 26, wherein adjusting a first spacing arrangement includes configuring an in-row separation to minimize crosstalk.

* * * * *